(12) United States Patent
Karasawa et al.

(10) Patent No.: US 11,194,251 B2
(45) Date of Patent: Dec. 7, 2021

(54) RESIST UNDERLAYER FILM-FORMING COMPOSITION FOR LITHOGRAPHY CONTAINING POLYMER HAVING BLOCKED ISOCYANATE STRUCTURE

(71) Applicant: NISSAN CHEMICAL INDUSTRIES, LTD., Tokyo (JP)

(72) Inventors: Ryo Karasawa, Toyama (JP); Tokio Nishita, Toyama (JP); Yasunobu Someya, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/303,979

(22) PCT Filed: May 11, 2015

(86) PCT No.: PCT/JP2015/063483
§ 371 (c)(1),
(2) Date: Oct. 13, 2016

(87) PCT Pub. No.: WO2015/178235
PCT Pub. Date: Nov. 26, 2015

(65) Prior Publication Data
US 2017/0045818 A1    Feb. 16, 2017

(30) Foreign Application Priority Data

May 22, 2014    (JP) .............................. JP2014-106315

(51) Int. Cl.
  *G03F 7/09* (2006.01)
  *G03F 7/26* (2006.01)
  (Continued)

(52) U.S. Cl.
  CPC .............. *G03F 7/094* (2013.01); *C08F 20/36* (2013.01); *C08F 20/58* (2013.01); *C09D 133/14* (2013.01); *C09D 133/26* (2013.01); *G03F 7/11* (2013.01); *G03F 7/162* (2013.01); *G03F 7/168* (2013.01); *G03F 7/2002* (2013.01); *G03F 7/2037* (2013.01); *G03F 7/26* (2013.01);
  (Continued)

(58) Field of Classification Search
  CPC ........ C08F 20/36; C08F 20/58; C09D 133/14; C09D 133/26
  See application file for complete search history.

(56) References Cited

U.S. PATENT DOCUMENTS 6,803,168 B1 *   10/2004   Padmanaban ......... C08F 220/34
                                                          430/270.1
2010/0022089 A1 *   1/2010   Takei et al. ........... G03F 7/0752
                                                          438/703
(Continued)

FOREIGN PATENT DOCUMENTS

EP    1 035 147 A1 *   9/2000   ............. C08G 18/80
JP    2001-027810 A    1/2001
(Continued)

OTHER PUBLICATIONS

Jun. 23, 2015 International Search Report issued in International Patent Application No. PCT/JP2015/063483.

*Primary Examiner* — John A McPherson
*Assistant Examiner* — Nicholas E Brown
(74) *Attorney, Agent, or Firm* — Oliff PLC

(57) ABSTRACT

A resist underlayer film-forming composition for lithography capable of being dry-etched during pattern transfer from the upper layer or during substrate processing and capable of being removed with an alkaline aqueous solution after the substrate processing. The composition includes a polymer (A) having an acrylamide structure or an acrylic acid ester structure; a polymer (B) having a blocked isocyanate structure; and a solvent (C). The polymer (A) is a polymer including a unit structure of Formula (1). The polymer (B) is a polymer including a unit structure of Formula (2). A method for manufacturing a semiconductor device includes steps for: forming a resist pattern; etching an inorganic hard mask layer with use of the resist pattern; etching a resist underlayer film with use of the pattered inorganic hard mask layer; and processing a semiconductor substrate with use of the pattered resist underlayer film.

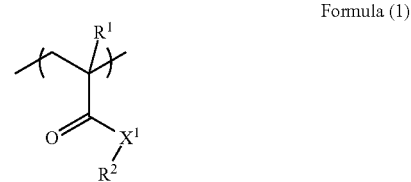

Formula (1)

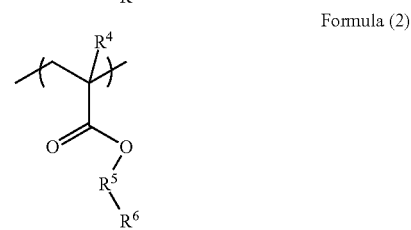

Formula (2)

4 Claims, No Drawings

(51) Int. Cl.
*G03F 7/11* (2006.01)
*H01L 21/033* (2006.01)
*H01L 21/027* (2006.01)
*C08F 20/36* (2006.01)
*C08F 20/58* (2006.01)
*C09D 133/14* (2006.01)
*C09D 133/26* (2006.01)
*G03F 7/20* (2006.01)
*H01L 21/308* (2006.01)
*G03F 7/16* (2006.01)

(52) U.S. Cl.
CPC ...... *H01L 21/0271* (2013.01); *H01L 21/0332* (2013.01); *H01L 21/3081* (2013.01); *H01L 21/3086* (2013.01)

(56) References Cited

U.S. PATENT DOCUMENTS

| | | | |
|---|---|---|---|
| 2014/0106570 A1* | 4/2014 | Someya | H01L 21/3081 438/703 |
| 2015/0050593 A1* | 2/2015 | Adachi | C08F 222/40 430/280.1 |
| 2015/0194312 A1* | 7/2015 | Someya | G03F 7/094 438/703 |

FOREIGN PATENT DOCUMENTS

| | | |
|---|---|---|
| JP | 2002-357901 A | 12/2002 |
| JP | 2006-307230 A | 11/2006 |
| JP | 2009-025670 A | 2/2009 |
| JP | 2014-074730 A | 4/2014 |
| WO | 2000/001752 A1 | 1/2000 |
| WO | 2012/161126 A1 | 11/2012 |
| WO | 2014/007079 A1 | 1/2014 |
| WO | 2015/111724 A1 | 7/2015 |

* cited by examiner

RESIST UNDERLAYER FILM-FORMING COMPOSITION FOR LITHOGRAPHY CONTAINING POLYMER HAVING BLOCKED ISOCYANATE STRUCTURE

TECHNICAL FIELD

The present invention relates to a resist underlayer film-forming composition for lithography that is effective in semiconductor substrate processing, and relates to a method of forming a resist pattern using the resist underlayer film-forming composition, and a method of manufacturing a semiconductor device.

BACKGROUND ART

In the manufacture of semiconductor devices, fine processing by lithography using a photoresist composition has conventionally been performed. The fine processing is a processing method of forming a thin film of a photoresist composition on a substrate to be processed such as a silicon wafer; irradiating the thin film with an active ray such as ultraviolet ray through a mask pattern having a semiconductor device pattern depicted therein, thereby carrying out development, and etching the substrate to be processed such as a silicon wafer with the obtained photoresist pattern as a protection film. However, with the higher integration of semiconductor devices in recent years, an active ray employed tends to have a shorter wavelength, namely, shift from KrF excimer laser (248 nm) to ArF excimer laser (193 nm). Accordingly, the influence of diffuse reflection of the active ray on the substrate or the influence of standing waves has become a serious problem. Consequently, a method of providing an anti-reflective coating (bottom anti-reflective coating, BARC) between a photoresist and a substrate to be processed has been widely studied. For example, a photosensitive resist underlayer film-forming composition containing a polymer having an acrylamide structure is disclosed (refer to Patent Document 1).

A resist underlayer film-forming composition containing a polymer having a unit structure of hydroxyacrylamide is disclosed (refer to Patent Document 2).

An anti-reflective coating-forming composition containing a polymer having a unit structure of hydroxyalkylen-emethacrylamide and a unit structure of aromatic alkylene methacrylate is disclosed (refer to Patent Document 3).

In the future, when a finer resist pattern is further pursued, a problem about resolution or a problem of collapse of a resist pattern after development should arise, thereby causing a demand for reducing the film thickness of a resist. It is therefore difficult to attain a resist pattern film thickness sufficient for processing a substrate, and there has arisen a need for a process for allowing not only a resist pattern but also a resist underlayer film formed between a resist and a semiconductor substrate to be processed to function as a mask in substrate processing. As the resist underlayer film for such a process, unlike conventional high etch rate (high etching rate) resist underlayer films, there is a growing demand for a resist underlayer film for lithography having a selection ratio of dry etching rate close to that of a resist, a resist underlayer film for lithography having a selection ratio of dry etching rate smaller than that of a resist, and a resist underlayer film for lithography having a selection ratio of dry etching rate smaller than that of a semiconductor substrate.

An organic hard mask layer-forming composition having an acrylamide structure and being removable by an alkaline aqueous solution is disclosed (refer to Patent Document 4).

A method of manufacturing a semiconductor device using a polymer having a blocked isocyanate group is disclosed (refer to Patent Document 5).

PRIOR ART DOCUMENTS

Patent Documents

Patent Document 1: International Application Pamphlet WO 2005/111724
Patent Document 2: Japanese Unexamined Patent Application Publication No. 2009-025670 (JP 2009-025670 A)
Patent Document 3: Japanese Unexamined Patent Application Publication No. 2001-027810 (JP 2001-027810 A)
Patent Document 4: International Application Pamphlet WO 2012/161126
Patent Document 5: International Application Pamphlet WO 2014/007079

SUMMARY OF THE INVENTION

Problem to be Solved by the Invention

An object of the present invention is to provide a resist underlayer film-forming composition for use in a lithography process in the manufacture of semiconductor devices. Another object of the present invention is to provide a resist underlayer film for lithography having a selection ratio of dry etching rate close to that of a resist, a resist underlayer film for lithography having a selection ratio of dry etching rate smaller than that of the resist, and a resist underlayer film for lithography having a selection ratio of dry etching rate smaller than that of a semiconductor substrate, the resist underlayer films for lithography allowing an excellent resist pattern to be obtained without causing intermixing with an inorganic hard mask layer. Another object of the present invention is to impart, to a resist underlayer film, the performance of effectively absorbing light reflected on a substrate when irradiated light having a wavelength of, for example, 248 nm, 193 nm, or 157 nm is used for fine processing. A further object of the present invention is to provide a method of forming a resist pattern using a resist underlayer film-forming composition. A further object of the present invention is to provide a resist underlayer film-forming composition for forming a resist underlayer film capable of being dry-etched during pattern transfer from the upper layer or during substrate processing and capable of being removed with an alkaline aqueous solution after the substrate processing.

Means for Solving the Problem

The present invention provides: according to a first aspect, a resist underlayer film-forming composition for lithography comprising a polymer (A) having an acrylamide structure or an acrylic acid ester structure, a polymer (B) having a blocked isocyanate structure, and a solvent (C);

according to a second aspect, the resist underlayer film-forming composition according to the first aspect, in which the polymer (A) is a polymer including a unit structure of Formula (1):

Formula (1)

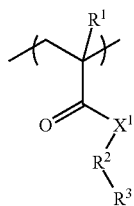

(where $R^1$ is a hydrogen atom or a methyl group, $X^1$ is an NH group or an oxygen atom, $R^2$ is an aromatic ring, and $R^3$ is a hydroxy group or a carboxy group);

according to a third aspect, the resist underlayer film-forming composition according to the second aspect, in which, in Formula (1), $R^2$ is a benzene ring;

according to a fourth aspect, the resist underlayer film-forming composition according to any one of the first aspect to the third aspect, in which the polymer (B) is a polymer including a unit structure of Formula (2):

Formula (2)

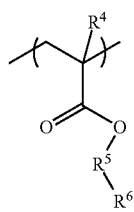

(where $R^4$ is a hydrogen atom or a methyl group, $R^5$ is a single bond or an alkylene group, and $R^6$ is a blocked isocyanate group);

according to a fifth aspect, the resist underlayer film-forming composition according to any one of the first aspect to the fourth aspect, in which the polymer (A) and the polymer (B) are included such that the molar ratio of the hydroxy group or the carboxy group to the blocked isocyanate group is 1:0.005 to 1.0;

according to a sixth aspect, the resist underlayer film-forming composition according to any one of the first aspect to the fifth aspect, further comprising a crosslinking catalyst;

according to a seventh aspect, a method of manufacturing a semiconductor device, the method comprising: forming a resist underlayer film from the resist underlayer film-forming composition according to any one of the first aspect to the sixth aspect on a semiconductor substrate; forming a resist film on the resist underlayer film; forming a resist pattern in the resist film through light or electron beam irradiation and development; etching the resist underlayer film using the formed resist pattern; and processing the semiconductor substrate using the patterned resist underlayer film; and according to an eighth aspect, a method of manufacturing a semiconductor device, the method comprising: forming a resist underlayer film from the resist underlayer film-forming composition according to any one of the first aspect to the sixth aspect on a semiconductor substrate; forming an inorganic hard mask layer on the resist underlayer film; further forming a resist film on the inorganic hard mask layer; forming a resist pattern in the resist film through light or electron beam irradiation and development; etching the inorganic hard mask layer using the formed resist pattern; etching the resist underlayer film using the patterned inorganic hard mask layer; and processing the semiconductor substrate using the patterned resist underlayer film.

Effects of the Invention

A resist underlayer film formed from the resist underlayer film-forming composition of the present invention can be used to form a good resist pattern shape without causing intermixing with an inorganic hard mask layer provided above the resist underlayer film.

Furthermore, the resist underlayer film-forming composition of the present invention can provide an excellent resist underlayer film having a selection ratio of dry etching rate close to that of a resist, a selection ratio of dry etching rate smaller than that of a resist, or a selection ratio of dry etching rate smaller than that of a semiconductor substrate.

Therefore, with the resist underlayer film obtained from the resist underlayer film-forming composition of the present invention, a resist pattern transferred to an inorganic hard mask layer serving as an upper layer can be transferred to the resist underlayer film by dry etching. Furthermore, with the resist pattern transferred to the resist underlayer film, a semiconductor substrate can be processed by dry etching.

Furthermore, the resist underlayer film-forming composition of the present invention can impart the performance of efficiently controlling reflection on the substrate to the resist underlayer film formed of the resist underlayer film-forming composition, so that the resist underlayer film can additionally have an effect as an anti-reflective coating against exposure light.

Therefore, the resist underlayer film formed from the resist underlayer film-forming composition for lithography of the present invention can be used as a planarizing film, an anti-contamination film for a resist layer, and a film having dry etch selectivity. Accordingly, resist pattern formation in a lithography process in the manufacture of a semiconductor device can be performed easily and accurately.

Furthermore, the resist underlayer film-forming composition for lithography of the present invention has high thermal stability, and therefore, the resist underlayer film formed from the composition can prevent contamination of the upper layer film by a decomposed product during vacuum deposition and baking for forming an inorganic hard mask layer and can provide a sufficient temperature margin in a baking process.

Furthermore, the resist underlayer film formed from the resist underlayer film-forming composition for lithography of the present invention can be removed with an alkaline aqueous solution after the processing of a semiconductor substrate.

MODES FOR CARRYING OUT THE INVENTION

The present invention provides a resist underlayer film-forming composition for lithography, the composition comprising: a polymer (A) having an acrylamide structure or an acrylic acid ester structure; a polymer (B) having a blocked isocyanate structure; and a solvent (C).

The resist underlayer film-forming composition of the present invention may include additives, such as an acid generator and a surfactant, as necessary. The solid content of this composition is 0.1% by mass to 70% by mass or 0.1% by mass to 60% by mass. The solid content means the content of components remaining after removal of the solvent (C) from the resist underlayer film-forming composition.

The total amount of the polymer (A) and the polymer (B) contained in the solid content may be 1% by mass to 100% by mass, 1% by mass to 99% by mass, or 50% by mass to 98% by mass.

The weight average molecular weight of the polymer (A) may be in a range of, for example, from 1,000 to 1,000,000, from 1,000 to 100,000, or from 1,000 to 50,000.

The polymer (A) preferably includes a unit structure of Formula (1), where $R^1$ is a hydrogen atom or a methyl group, $X^1$ is an NH group or an oxygen atom, $R^2$ is an aromatic ring, and $R^3$ is a hydroxy group or a carboxy group.

The polymer (B) preferably includes a unit structure of Formula (2), where $R^4$ is a hydrogen atom or a methyl group, $R^5$ is a single bond or an alkylene group, and $R^6$ is a blocked isocyanate group.

The weight average molecular weight of the polymer (B) may be in a range of, for example, from 1,000 to 1,000,000, from 1,000 to 100,000, or from 1,000 to 50,000.

In the present invention, the polymer (A) and the polymer (B) may be contained such that the molar ratio of the hydroxy group or the carboxy group to the blocked isocyanate group is 1:0.005 to 1.0.

Examples of the aromatic ring include a benzene ring, a naphthalene ring, an anthracene ring, and a biphenyl ring, and a particularly preferred aromatic ring is a benzene ring.

Examples of the alkylene group include alkylene groups corresponding to alkyl groups below, and examples of the alkyl groups include $C_{1-10}$ alkyl groups. Examples of the $C_{1-10}$ alkyl groups include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The blocked isocyanate group refers to an organic group in which an isocyanate group (—N═C═O) is blocked by an appropriate protecting group.

The blocked isocyanate group can be formed by reacting an isocyanate group with a blocking agent.

In a reaction with the hydroxy group or the carboxy group in the polymer (A), the blocking agent is removed, and the isocyanate group reacts with the hydroxy group or the carboxy group to form a crosslinking structure.

The blocking agent is an active hydrogen-containing compound capable of reacting with isocyanate, and examples of the blocking agent include alcohol, phenol, polycyclic phenol, amide, imide, imine, thiol, oxime, lactam, an active hydrogen-containing heterocyclic ring, and an active methylene-containing compound.

Examples of the alcohol serving as the blocking agent include $C_{1-40}$ alcohol, such as methanol, ethanol, propanol, isopropanol, butanol, pentanol, hexanol, octanol, ethylene chlorohydrin, 1,3-dichloro-2-propanol, t-butanol, t-pentanol, 2-ethylhexanol, cyclohexanol, lauryl alcohol, ethylene glycol, butylene glycol, trimethylolpropane, glycerol, ethylene glycol monomethyl ether, ethylene glycol monoethyl ether, ethylene glycol monobutyl ether, diethylene glycol monomethyl ether, propylene glycol monomethyl ether, propylene glycol monoethyl ether, and benzyl alcohol.

Examples of the phenol serving as the blocking agent include $C_{6-20}$ phenols, such as phenol, chlorophenol, and nitrophenol.

Examples of the phenol derivative serving as the blocking agent include $C_{6-20}$ phenol derivatives, and examples of the $C_{6-20}$ phenol derivative include para-t-butyl phenol, cresol, xylenol, and resorcinol.

Examples of a polycyclic phenol serving as the blocking agent include $C_{10-20}$ polycyclic phenols that are aromatic condensed rings having a phenolic hydroxy group, such as hydroxynaphthalene and hydroxyanthracene.

Examples of the amide serving as the blocking agent include $C_{1-20}$ amides, such as acetanilide, hexanamide, octanediamide, succinamide, benzenesulfonamide, and ethanediamide.

Examples of the imide serving as the blocking agent include $C_{6-20}$ imides, such as cyclohexanedicarboxyimide, cyclohexanedicarboxyimide, benzenedicarboxyimide, cyclobutanedicarboxyimide, and carbodiimide.

Examples of the imine serving as the blocking agent include $C_{1-20}$ imines, such as hexane-1-imine, 2-propanimine, and ethane-1,2-imine.

Examples of the thiol serving as the blocking agent include $C_{1-20}$ thiols, such as ethanethiol, butanethiol, thiophenol, and 2,3-butanedithiol.

Examples of the oxime serving as the blocking agent include $C_{1-20}$ oximes, such as acetoxime, methylethylketoxime, cyclohexanone oxime, dimethylketoxime, methylisobutylketoxime, methylamylketoxime, formamide oxime, acetaldoxime, diacetyl monoxime, benzophenone oxime, and cyclohexane oxime.

Examples of the lactam serving as the blocking agent include $C_{4-20}$ lactams, such as ε-caprolactam, δ-valerolactam, γ-butyrolactam, β-propyllactam, γ-pyrrolidone, and lauryllactam.

Examples of the active hydrogen-containing heterocyclic compound serving as the blocking agent include $C_{3-30}$ active hydrogen-containing heterocyclic compounds, such as pyrrole, imidazole, pyrazole, piperidine, piperazine, morpholine, pyrindine, indole, indazole, purine, and carbazole.

Examples of the active methylene-containing compound serving as the blocking agent include $C_{3-20}$ active methylene containing compounds, such as dimethyl malonate, diethyl malonate, methyl acetoacetate, ethyl acetoacetate, and acetylacetone.

The structure of the polymer (A) used in the present invention can be illustrated as below.
Formula (A-1)
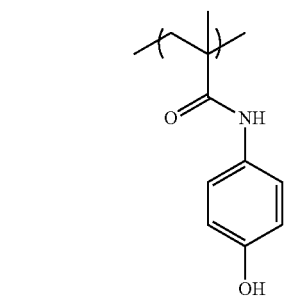
Formula (A-2)
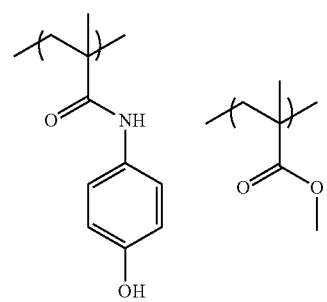
Formula (A-3)
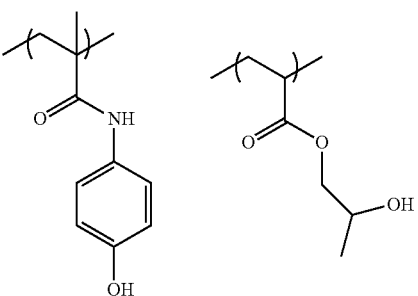
Formula (A-4)
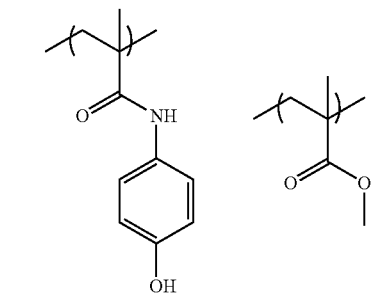
Formula (A-5)
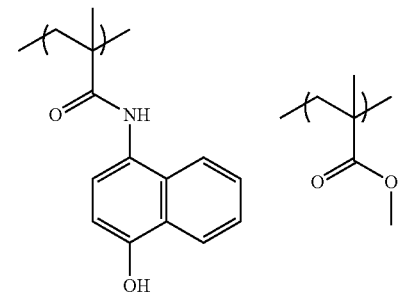
Formula (A-6)
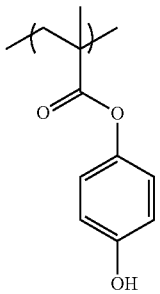
Formula (A-7)
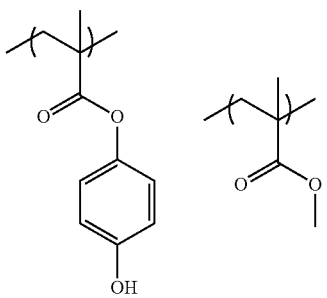
Formula (A-8)
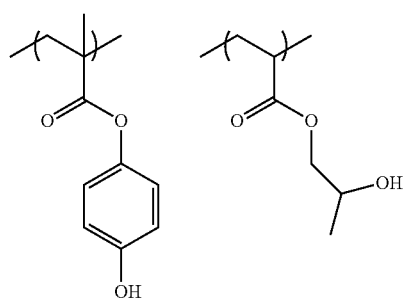
Formula (A-9)
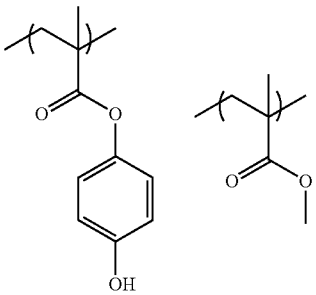
Formula (A-10)
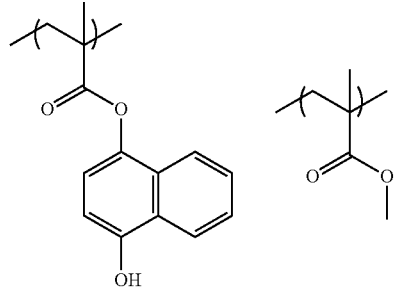

The structure of the polymer (B) used in the present invention can be illustrated as below.

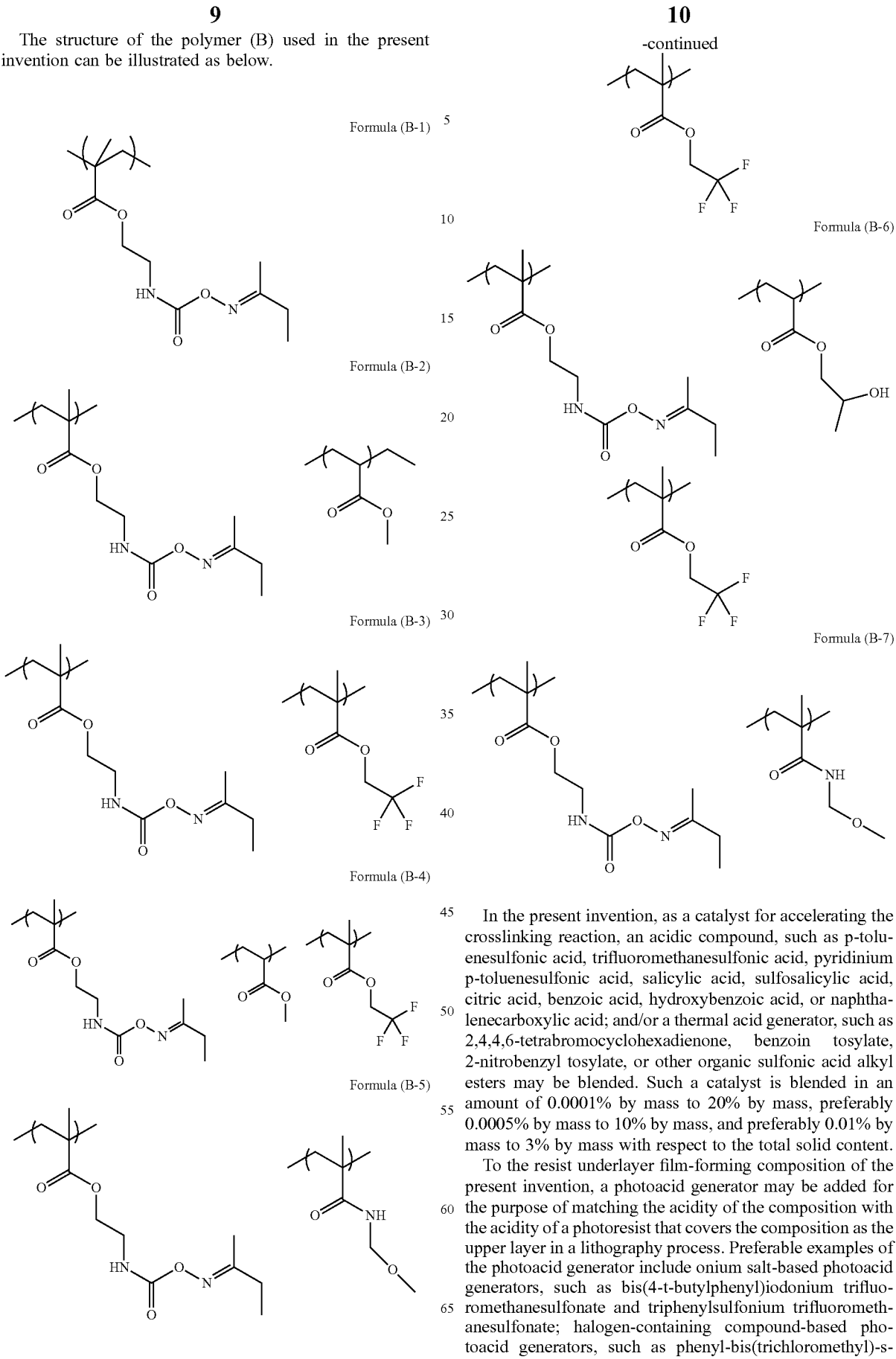

In the present invention, as a catalyst for accelerating the crosslinking reaction, an acidic compound, such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, or naphthalenecarboxylic acid; and/or a thermal acid generator, such as 2,4,4,6-tetrabromocyclohexadienone, benzoin tosylate, 2-nitrobenzyl tosylate, or other organic sulfonic acid alkyl esters may be blended. Such a catalyst is blended in an amount of 0.0001% by mass to 20% by mass, preferably 0.0005% by mass to 10% by mass, and preferably 0.01% by mass to 3% by mass with respect to the total solid content.

To the resist underlayer film-forming composition of the present invention, a photoacid generator may be added for the purpose of matching the acidity of the composition with the acidity of a photoresist that covers the composition as the upper layer in a lithography process. Preferable examples of the photoacid generator include onium salt-based photoacid generators, such as bis(4-t-butylphenyl)iodonium trifluoromethanesulfonate and triphenylsulfonium trifluoromethanesulfonate; halogen-containing compound-based photoacid generators, such as phenyl-bis(trichloromethyl)-s- triazine; sulfonic acid-based photoacid generators, such as benzoin tosylate and N-hydroxysuccinimide trifluoromethanesulfonate. The photoacid generator may be added in an amount of 0.2% by mass to 10% by mass, and preferably 0.4% by mass to 5% by mass with respect to the total solid content.

Besides the substances described above, an additional light absorbing agent, a rheology controlling agent, an adhesion assistant, a surfactant, or other substances may be added to the resist underlayer film-forming composition for lithography of the present invention, as necessary.

Preferable examples of the additional light absorbing agent include commercially available light absorbing agents described in "Kogyoyo shikiso no gijyutu to shijyo (technology and market of industrial dyes)" (CMC Publishing Co., Ltd.) and "Senryo Binran (dye handbook)" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbing agent is blended in an amount of usually 10% by mass or less, and preferably 5% by mass or less with respect to the total solid content of the resist underlayer film-forming composition for lithography.

The rheology controlling agent is added mainly for the purpose of improving the fluidity of the resist underlayer film-forming composition, particularly for the purpose of improving the film thickness uniformity of the resist underlayer film and enhancing filling of the resist underlayer film-forming composition into holes during a baking process. Specific examples of the rheology controlling agent include phthalic acid derivatives, such as dimethyl phthalate, diethyl phthalate, diisobutyl phthalate, dihexyl phthalate, and butylisodecyl phthalate; adipic acid derivatives, such as di-n-butyl adipate, diisobutyl adipate, diisooctyl adipate, and octyldecyl adipate; maleic acid derivatives, such as di-n-butyl maleate, diethyl maleate, and dinonyl maleate; oleic acid derivatives, such as methyl oleate, butyl oleate, and tetrahydrofurfuryl oleate; and stearic acid derivatives, such as n-butyl stearate and glyceryl stearate. Such a rheology controlling agent is blended in an amount of usually less than 30% by mass with respect to the total solid content of the resist underlayer film-forming composition for lithography.

The adhesion assistant is added mainly for the purpose of improving adhesion between the resist underlayer film and a substrate or a resist, particularly for the purpose of preventing separation of the resist during development. Specific examples of the adhesion assistant include chlorosilanes, such as trimethylchlorosilane, dimethylvinylchlorosilane, methyldiphenylchlorosilane, and chloromethyldimethylchlorosilane; alkoxysilanes, such as trimethylmethoxysilane, dimethyldiethoxysilane, methyldimethoxysilane, dimethylvinylethoxysilane, diphenyldimethoxysilane, and phenyltriethoxysilane; silazanes, such as hexamethyldisilazane, N,N-bis(trimethylsilyOurea, dimethyltrimethylsilylamine, and trimethylsilylimidazole; silanes, such as vinyltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, and mercaptopyrimidine; ureas, such as 1,1-dimethylurea and 1,3-dimethylurea; and thiourea compounds. Such an adhesion assistant is blended in an amount of usually less than 5% by mass, and preferably less than 2% by mass with respect to the total solid content of the resist underlayer film-forming composition for lithography.

In the resist underlayer film-forming composition for lithography of the present invention, a surfactant may be blended for the purpose of preventing pinholes and striations and further improving coating properties against surface coating irregularities. Examples of the surfactant include nonionic surfactants, such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants, such as EFTOP EF301, EF303, and EF352 (trade name, manufactured by Tohkem Products Corporation), MEGAFACE F171, F173, R-30, R-40, and R-40LM (trade name, manufactured by DIC Corporation), Fluorad FC430 and FC431 (trade name, manufactured by Sumitomo 3M Limited), Asahi Guard AG710, and SURFLON S-382, SC101, SC102, SC103, SC104, SC105, and SC106 (trade name, manufactured by Asahi Glass Co., Ltd.); and an organosiloxane polymer KP341 (manufactured by Shin-Etsu Chemical Co., Ltd.). Such a surfactant is blended in an amount of usually 2.0% by mass or less, and preferably 1.0% by mass or less with respect to the total solid content of the resist underlayer film-forming composition for lithography of the present invention. These surfactants may be added singly or in combination of two or more of them.

In the present invention, as the solvent (C) to dissolve the polymers, the crosslinking catalyst, and other ingredients, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate may be used. These organic solvents may be used singly or in combination of two or more of them.

Furthermore, a high-boiling point solvent, such as propylene glycol monobutyl ether or propylene glycol monobutyl ether acetate, may be mixed and used. Among these solvents, propylene glycol monomethyl ether, propylene glycol monomethyl ether acetate, ethyl lactate, butyl lactate, and cyclohexanone are preferable in terms of improving the leveling property.

As the resist used in the present invention, a photoresist and an electron beam resist may be employed.

Negative and positive photoresists may both be used as the photoresist applied to the upper part of the resist underlayer film formed from the resist underlayer film-forming composition for lithography of the present invention. Examples of the photoresist include a positive photoresist made of a novolac resin and a 1,2-naphthoquinone diazide sulfonic acid ester; a chemically amplified photoresist made of a photoacid generator and a binder having a group that is decomposed by an acid to increase an alkali dissolution rate; a chemically amplified photoresist made of an alkali-soluble binder, a low molecular weight compound that is decomposed by an acid to increase the alkali dissolution rate of the photoresist, and a photoacid generator; a chemically amplified photoresist made of a binder having a group that is decomposed by an acid to increase an alkali dissolution rate, a low molecular weight compound that is decomposed by an acid to increase the alkali dissolution rate of the photoresist, and a photoacid generator; and a photoresist having a Si atom in its skeleton. Specific examples thereof include trade-named APEX-E, manufactured by Rohm and Haas Corporation.

Examples of the electron beam resist applied to the upper part of the resist underlayer film for lithography formed from the composition of the present invention include a composition including a resin having a Si—Si bond in its main chain and an aromatic ring at its end and an acid generator that generates an acid by electron beam irradiation, and a composition including a poly(p-hydroxystyrene) in which a hydroxy group is substituted with an organic group containing N-carboxyamine and an acid generator that generates an acid by electron beam irradiation. The latter electron beam resist composition is such that an acid generated from the acid generator by electron beam irradiation reacts with the N-carboxy aminoxy group in a polymer side chain, and the polymer side chain is decomposed into a hydroxy group to exhibit alkali solubility, whereby the resist composition is dissolved in an alkaline developer to form a resist pattern. Examples of the acid generator that generates an acid by electron beam irradiation include halogenated organic compounds, such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts, such as triphenylsulfonium salts and diphenyliodonium salts; and sulfonic acid esters, such as nitrobenzyl tosylate and dinitrobenzyl tosylate.

As a developer for a resist having the resist underlayer film formed using the resist underlayer film-forming composition for lithography of the present invention, an aqueous solution of alkalis may be used. Examples of the alkalis include inorganic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and methyldiethylamine; alcohol amines, such as dimethylethanolamine and triethanolamine; quaternary ammonium salts, such as tetramethylammonium hydroxide, tetraethylammonium hydroxide, and choline; and cyclic amines, such as pyrrole and piperidine. To the aqueous solution of the alkalis, an adequate amount of alcohols such as isopropyl alcohol and a surfactant such as a nonionic surfactant may be added and used. Among these developers, quaternary ammonium salts are preferable, and tetramethylammonium hydroxide and choline are more preferable.

Next, a method of forming a resist pattern according to the present invention will be described. The resist underlayer film-forming composition is applied to a substrate for use in the manufacture of precision integrated circuit elements (for example, a transparent substrate, such as a silicon/silicon dioxide coating, a glass substrate, or an ITO substrate) by an appropriate coating method, such as a spinner or a coater, and then baked and cured to produce a coating-type resist underlayer film. Here, the film thickness of the resist underlayer film is preferably 0.01 µm to 3.0 µm. The conditions of the baking after the coating are 80° C. to 400° C. for 0.5 minutes to 120 minutes. Subsequently, a resist is applied directly to the resist underlayer film, or, as necessary, applied to a single layer to several layers of a coating material deposited on the coating-type resist underlayer film, and the resist is irradiated with light or electron beam through a predetermined mask and developed, followed by rinsing and drying, whereby a good resist pattern is obtained. Heating after the light or electron beam irradiation (PEB: Post Exposure Bake) may be performed as necessary. Then, a portion of the resist underlayer film in which the resist is developed and removed through the above-described steps is removed by dry etching to form a predetermined pattern on the substrate.

The exposure light used for the photoresist is actinic rays, such as near ultraviolet rays, far ultraviolet rays, or extreme ultraviolet rays (for example, EUV). For example, a beam having a wavelength of 248 nm (KrF laser beam), 193 nm (ArF laser beam), or 157 nm ($F_2$ laser beam) is used. Any light irradiation method may be used without a particular limit as long as the method is capable of generating an acid from a photoacid generator, with an exposure of 1 $mJ/cm^2$ to 2,000 $mJ/cm^2$, 10 $mJ/cm^2$ to 1,500 $mJ/cm^2$, or 50 $mJ/cm^2$ to 1,000 $mJ/cm^2$.

The electron beam irradiation for the electron beam resist may be carried out using, for example, an electron beam irradiator.

In the present invention, a semiconductor device can be manufactured through the steps of: forming a resist underlayer film from the resist underlayer film-forming composition of the present invention on a semiconductor substrate; forming a resist film on the resist underlayer film; forming a resist pattern through light or electron beam irradiation and development; etching the resist underlayer film with the formed resist pattern; and processing the semiconductor substrate using the patterned resist underlayer film.

In the future, when a finer resist pattern is further pursued, a problem about resolution or a problem of collapse of a resist pattern after development will arise, thereby causing a demand for reducing the film thickness of a resist. It is therefore difficult to attain a resist pattern film thickness sufficient for processing a substrate, and there has arisen a need for a process that allows not only a resist pattern but also the resist underlayer film formed between a resist and a semiconductor substrate to be processed to function as a mask in substrate processing. As the resist underlayer film for such process, unlike conventional high etch rate resist underlayer films, there is a growing demand for a resist underlayer film for lithography having a selection ratio of dry etching rate close to that of a resist, a resist underlayer film for lithography having a selection ratio of dry etching rate smaller than that of a resist, and a resist underlayer film for lithography having a selection ratio of dry etching rate smaller than that of a semiconductor substrate. Furthermore, an anti-reflective function can be imparted to such resist underlayer films, so that the resist underlayer films can additionally have the function of conventional anti-reflective coatings.

Meanwhile, for the purpose of attaining a fine resist pattern, a process in which, in dry etching of a resist pattern, the width of a resist pattern and the resist underlayer film are made thinner than the pattern width at the time of resist development has come to be used. As the resist underlayer film for such process, there is a growing demand for a resist underlayer film having a selection ratio of dry etching rate close to that of a resist, unlike conventional high etch rate anti-reflective coatings. Furthermore, an anti-reflective function can be imparted to such resist underlayer film, so that the resist underlayer film can additionally have the function of conventional anti-reflective coatings.

In a process using such a thin-film resist, a resist pattern is transferred to the underlayer film in an etching process, and a substrate is processed using the underlayer film as a mask; or the step of transferring a resist pattern to the underlayer film in an etching process and further transferring the pattern transferred to the underlayer film to a film under the underlayer film using a different gas composition is repeated, and finally, a substrate is processed. The resist underlayer film-forming composition of the present invention and the resist underlayer film formed from the composition are effective in this process, and have sufficient etching resistance for a substrate to be processed (for example, a thermally oxidized silicon film, a silicon nitride film, or a polysilicon film, on a substrate) when the substrate is processed using the resist underlayer film formed from the composition of the present invention.

According to the present invention, after the resist underlayer film of the present invention is formed on a substrate, a resist can be applied directly to the resist underlayer film, or, as necessary, applied to a single layer to several layers of a coating material deposited on the resist underlayer film. The resulting pattern width of the resist is reduced, and even when the resist is thinly applied for the purpose of preventing pattern collapse, the substrate can be processed by selecting an appropriate etching gas.

That is, a semiconductor device can be manufactured through the steps of: forming a resist underlayer film from the resist underlayer film-forming composition of the present invention on a semiconductor substrate; forming an inorganic hard mask layer using a coating material containing a silicon component and other substances on the resist underlayer film; forming a resist film on the inorganic hard mask layer; forming a resist pattern through light or electron beam irradiation and development; etching the inorganic hard mask layer with the formed resist pattern; etching the resist underlayer film using the patterned inorganic hard mask layer; and processing the semiconductor substrate using the patterned resist underlayer film.

In the process comprising: forming a resist underlayer film on a substrate from a resist underlayer film-forming composition; forming an inorganic hard mask layer on the resist underlayer film; forming a resist film on the inorganic hard mask layer; forming a resist pattern by exposure and development; transferring the formed resist pattern to the inorganic hard mask layer; transferring the resist pattern transferred to the inorganic hard mask layer to the resist underlayer film; and processing the semiconductor substrate using the resist underlayer film, the resist underlayer film-forming composition of the present invention is advantageous in terms of the followings. In this process, the inorganic hard mask layer is formed with a coating-type composition containing an organic polymer or an inorganic polymer and a solvent, or formed by vacuum evaporation of an inorganic substance. In the case of the vacuum evaporation of an inorganic substance (for example, silicon oxynitride), an evaporated substance is deposited on the surface of the resist underlayer film, and at this time, the temperature of the surface of the resist underlayer film sometimes increases to about 400° C. Against this temperature increase, the resist underlayer film-forming composition for lithography of the present invention has high thermal stability, and therefore, the resist underlayer film formed from the composition can prevent contamination of an upper layer film by a decomposed product during vacuum deposition and baking for forming the inorganic hard mask layer, and can provide a sufficient temperature margin in the baking process.

Furthermore, in consideration of the effect of the resist underlayer film-forming composition for lithography of the present invention as an anti-reflective coating, since a light-absorbing moiety of the composition is incorporated in a skeleton, no substance diffuses into the photoresist during heating and drying, and, since the light-absorbing moiety has sufficiently high light-absorbing properties, the high anti-reflective-light effect is exhibited.

Furthermore, the resist underlayer film-forming composition for lithography of the present invention can be used as a material for forming a film having the function of preventing reflection of light, and the function of preventing interaction between a substrate and a photoresist or the function of preventing adverse effects, on the substrate, of a material used for the photoresist or a substance produced during exposure of the photoresist, depending on process conditions.

Therefore, the resist underlayer film formed from the resist underlayer film-forming composition for lithography of the present invention can be used as a planarizing film, an anti-contamination film for a resist layer, and a film having dry etch selectivity. Accordingly, resist pattern formation in a lithography process in the manufacture of a semiconductor device can be performed easily and accurately.

The resist underlayer film formed from the composition of the present invention can be removed with an alkaline aqueous solution after the processing of a semiconductor substrate.

EXAMPLES

Weight-average molecular weights were measured by gel permeation chromatography (GPC).

In the measurement, a GPC apparatus manufactured by Tosoh Corporation was used. The measurement conditions were as follows.

GPC column: Shodex [registered trademark] Asahipak [registered trademark] (manufactured by Showa Denko K.K.)

Column temperature: 40° C.

Solvent: N,N-dimethylformamide (DMF)

Flow rate: 0.6 mL/min

Standard sample: Polystyrene (manufactured by Tosoh Corporation)

Synthesis Example 1

20.0 g of N-(4-hydroxyphenyl)methacrylamide (manufactured by Osaka Organic Chemical Industry Ltd.), 6.8 g of methyl methacrylate (manufactured by Tokyo Chemical Industry Co., Ltd.), 5.2 g of hydroxyethyl acrylate (manufactured by Tokyo Chemical Industry Co., Ltd.), and 4.8 g of 2,2-azobis(isobutylnitrile) (manufactured by Tokyo Chemical Industry Co., Ltd.) were added to 147.3 g of propylene glycol monomethyl ether, and dissolved therein. This solution was added dropwise to a 300 mL flask containing 61.4 g of propylene glycol monomethyl ether heated to 85° C., and after the completion of the dropwise addition, the mixture was stirred for approximately 15 hours. After the completion of the reaction, to this solution, 36.8 g of a cation exchange resin (trade name: DOWEX [registered trademark] 550A, manufactured by Muromachi Technos Co., Ltd.) and 36.8 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (A-2) above. In the polymer, the proportion of N-(4-hydroxyphenyl)methacrylamide unit:m-ethyl methacrylate unit:hydroxyethyl acrylate unit was 50 mol %:30 mol %:20 mol %. The result of GPC analysis of the obtained compound showed that the weight-average molecular weight Mw of the compound was 7,600 in terms of standard polystyrene.

Synthesis Example 2

25.0 g of N-(4-hydroxyphenyl)methacrylamide (manufactured by Osaka Organic Chemical Industry Ltd.), 18.4 g of hydroxypropyl acrylate (manufactured by Sigma-Aldrich Co. LLC.), and 6.5 g of 2,2-azobis(isobutylnitrile) (manufactured by Tokyo Chemical Industry Co., Ltd.) were added to 199.5 g of propylene glycol monomethyl ether, and dissolved therein. This solution was added dropwise to a 300 mL flask containing 83.1 g of propylene glycol monomethyl ether heated to 85° C., and after the completion of the dropwise addition, the mixture was stirred for approximately 15 hours. After the completion of the reaction, to this solution, 49.9 g of a cation exchange resin (trade name: DOWEX [registered trademark] 550A, manufactured by Muromachi Technos Co., Ltd.) and 49.9 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (A-3) above. In the polymer, the proportion of N-(4-hydroxyphenyl)methacrylamide unit:hydroxypropyl acrylate unit was 50 mol %:50 mol %. The result of GPC analysis of the obtained compound showed that the weight-average molecular weight Mw of the compound was 6,100 in terms of standard polystyrene.

Synthesis Example 3

25.0 g of 2-(O-[1'-methylpropylideneamino]carboxyamino)ethyl methacrylate ([registered trademark] Karenz MOI-BM, manufactured by Showa Denko K.K.) and 4.5 g of 2,2-azobis(isobutylnitrile) (manufactured by Tokyo Chemical Industry Co., Ltd.) were added to 118.0 g of propylene glycol monomethyl ether, and dissolved therein. This solution was added dropwise to a 300 mL flask containing 49.2 g of propylene glycol monomethyl ether heated to 85° C., and after the completion of the dropwise addition, the mixture was stirred for approximately 15 hours. After the completion of the reaction, to this solution, 29.5 g of a cation exchange resin (trade name: DOWEX [registered trademark] 550A, manufactured by Muromachi Technos Co., Ltd.) and 25.9 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-1) above. The polymer was a homopolymer of 2-(O-[1'-methylpropylideneamino]carboxyamino)ethyl methacrylate. The result of GPC analysis of the obtained compound showed that the weight-average molecular weight Mw of the compound was 7,200 in terms of standard polystyrene.

Synthesis Example 4

25.0 g of 2-(O-[1'-methylpropylideneamino]carboxyamino)ethyl methacrylate ([registered trademark] Karenz MOI-BM, manufactured by Showa Denko K.K.) and 5.0 g of 2,2-azobis(isobutylnitrile) (manufactured by Tokyo Chemical Industry Co., Ltd.) were added to 120.0 g of propylene glycol monomethyl ether, and dissolved therein. This solution was added dropwise to a 300 mL flask containing 50.0 g of propylene glycol monomethyl ether heated to 100° C., and after the completion of the dropwise addition, the mixture was stirred for approximately 15 hours. After the completion of the reaction, to this solution, 30.0 g of a cation exchange resin (trade name: DOWEX [registered trademark] 550A, manufactured by Muromachi Technos Co., Ltd.) and 30.0 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-1) above. The polymer was a homopolymer of 2-(O-[1'-methylpropylideneamino] carboxyamino)ethyl methacrylate. The result of GPC analysis of the obtained compound showed that the weight-average molecular weight Mw of the compound was 1,300 in terms of standard polystyrene.

Synthesis Example 5

20.0 g of 2-(O-[1'-methylpropylideneamino]carboxyamino)ethyl methacrylate ([registered trademark] Karenz MOI-BM, manufactured by Showa Denko K.K.), 7.1 g of methyl acrylate (manufactured by Tokyo Chemical Industry Co., Ltd.), and 4.9 g of 2,2-azobis(isobutylnitrile) (manufactured by Tokyo Chemical Industry Co., Ltd.) were added to 128.0 g of propylene glycol monomethyl ether, and dissolved therein. This solution was added dropwise to a 300 mL flask containing 53.3 g of propylene glycol monomethyl ether heated to 85° C., and after the completion of the dropwise addition, the mixture was stirred for approximately 15 hours. After the completion of the reaction, to this solution, 32.0 g of a cation exchange resin (trade name: DOWEX [registered trademark] 550A, manufactured by Muromachi Technos Co., Ltd.) and 32.0 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-2) above. In the polymer, the proportion of 2-(O-[1'-methylpropylideneamino]carboxyamino)ethyl methacrylate unit:

methyl acrylate unit was 50 mol %:50 mol %. The result of GPC analysis of the obtained compound showed that the weight-average molecular weight Mw of the compound was 4,300 in terms of standard polystyrene.

Synthesis Example 6

20.0 g of 2-(0-[1'-methylpropylideneamino]carboxyamino)ethyl methacrylate ([registered trademark] Karenz MOI-BM, manufactured by Showa Denko K.K.), 7.1 g of methyl acrylate (manufactured by Tokyo Chemical Industry Co., Ltd.), and 5.4 g of 2,2-azobis(isobutylnitrile) (manufactured by Tokyo Chemical Industry Co., Ltd.) were added to 130.1 g of propylene glycol monomethyl ether, and dissolved therein. This solution was added dropwise to a 300 mL flask containing 54.2 g of propylene glycol monomethyl ether heated to 100° C., and after the completion of the dropwise addition, the mixture was stirred for approximately 15 hours. After the completion of the reaction, to this solution, 32.5 g of a cation exchange resin (trade name: DOWEX [registered trademark] 550A, manufactured by Muromachi Technos Co., Ltd.) and 32.5 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-2) above. In the polymer, the proportion of 2-(0-[1'-methylpropylideneamino]carboxyamino)ethyl methacrylate unit:methyl acrylate unit was 50 mol %:50 mol %. The result of GPC analysis of the obtained compound showed that the weight-average molecular weight Mw of the compound was 2,746 in terms of standard polystyrene.

Synthesis Example 7

10.0 g of 2-(0-[1'-methylpropylideneamino]carboxyamino)ethyl methacrylate ([registered trademark] Karenz MOI-BM, manufactured by Showa Denko K.K.), 6.9 g of 2,2,2-trifluoroethyl methacrylate (manufactured by Tokyo Chemical Industry Co., Ltd.), and 3.3 g of 2,2-azobis(isobutylnitrile) (manufactured by Tokyo Chemical Industry Co., Ltd.) were added to 81.3 g of propylene glycol monomethyl ether, and dissolved therein. This solution was added dropwise to a 300 mL flask containing 33.9 g of propylene glycol monomethyl ether heated to 100° C., and after the completion of the dropwise addition, the mixture was stirred for approximately 15 hours. After the completion of the reaction, to this solution, 20.3 g of a cation exchange resin (trade name: DOWEX [registered trademark] 550A, manufactured by Muromachi Technos Co., Ltd.) and 20.3 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-3) above. In the polymer, the proportion of 2-(0-[1'-methylpropylideneamino]carboxyamino)ethyl methacrylate unit:2,2,2-trifluoroethyl methacrylate unit was 50 mol %:50 mol %. The result of GPC analysis of the obtained compound showed that the weight-average molecular weight Mw of the compound was 1,500 in terms of standard polystyrene.

Synthesis Example 8

10.0 g of 2-(0-[1'-methylpropylideneamino]carboxyamino)ethyl methacrylate ([registered trademark] Karenz MOI-BM, manufactured by Showa Denko K.K.), 2.1 g of methyl acrylate (manufactured by Tokyo Chemical Industry Co., Ltd.), 2.8 g of 2,2,2-trifluoroethyl methacrylate (manufactured by Tokyo Chemical Industry Co., Ltd.), and 3.0 g of 2,2-azobis(isobutylnitrile) (manufactured by Tokyo Chemical Industry Co., Ltd.) were added to 71.6 g of propylene glycol monomethyl ether, and dissolved therein. This solution was added dropwise to a 300 mL flask containing 29.8 g of propylene glycol monomethyl ether heated to 100° C., and after the completion of the dropwise addition, the mixture was stirred for approximately 15 hours. After the completion of the reaction, to this solution, 17.9 g of a cation exchange resin (trade name: DOWEX [registered trademark] 550A, manufactured by Muromachi Technos Co., Ltd.) and 17.9 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-4) above. In the polymer, the proportion of 2-(0-[1'-methylpropylideneamino]carboxyamino)ethyl methacrylate unit:methyl acrylate unit:2,2,2-trifluoroethyl methacrylate unit was 50 mol %:30 mol %:20 mol %. The result of GPC analysis of the obtained compound showed that the weight-average molecular weight Mw of the compound was 1,500 in terms of standard polystyrene.

Synthesis Example 9

10.0 g of 2-(0-[1'-methylpropylideneamino]carboxyamino)ethyl methacrylate ([registered trademark] Karenz MOI-BM, manufactured by Showa Denko K.K.), 2.1 g of methyl acrylate (manufactured by Tokyo Chemical Industry Co., Ltd.), 2.8 g of 2,2,2-trifluoroethyl methacrylate (manufactured by Tokyo Chemical Industry Co., Ltd.), and 3.0 g of 2,2-azobis(isobutylnitrile) (manufactured by Tokyo Chemical Industry Co., Ltd.) were added to 71.6 g of propylene glycol monomethyl ether, and dissolved therein. This solution was added dropwise to a 300 mL flask containing 29.9 g of propylene glycol monomethyl ether heated to 85° C., and after the completion of the dropwise addition, the mixture was stirred for approximately 15 hours. After the completion of the reaction, to this solution, 17.9 g of a cation exchange resin (trade name: DOWEX [registered trademark] 550A, manufactured by Muromachi Technos Co., Ltd.) and 17.9 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-4) above. In the polymer, the proportion of 2-(0-[1'-methylpropylideneamino]carboxyamino)ethyl methacrylate unit:methyl acrylate unit:2,2,2-trifluoroethyl methacrylate unit was 50 mol %:30 mol %:20 mol %. The result of GPC analysis of the obtained compound showed that the weight-average molecular weight Mw of the compound was 6,700 in terms of standard polystyrene.

Synthesis Example 10

10.0 g of 2-(0-[1'-methylpropylideneamino]carboxyamino)ethyl methacrylate ([registered trademark] Karenz MOI-BM, manufactured by Showa Denko K.K.), 1.1 g of N-methoxymethylmethacrylamide (manufactured by Wako Pure Chemical Industries, Ltd.), 5.6 g of 2,2,2-trifluoroethyl methacrylate (manufactured by Tokyo Chemical Industry Co., Ltd.), and 3.3 g of 2,2-azobis(isobutylnitrile) (manufactured by Tokyo Chemical Industry Co., Ltd.) were added to 79.8 g of propylene glycol monomethyl ether, and dissolved therein. This solution was added dropwise to a 300 mL flask containing 33.2 g of propylene glycol monomethyl ether heated to 100° C., and after the completion of the dropwise addition, the mixture was stirred for approximately 15 hours. After the completion of the reaction, to this solution, 20.0 g of a cation exchange resin (trade name: DOWEX [registered trademark] 550A, manufactured by Muromachi Technos Co., Ltd.) and 20.0 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-5) above. In the polymer, the proportion of 2-(0-[1'-methylpropylideneamino]carboxyamino)ethyl methacrylate unit:N-methoxymethylmethacrylamide unit:2,2,2-trifluoroethyl methacrylate unit was 50 mol %:10 mol %:40 mol %. The result of GPC analysis of the obtained compound showed that the weight-average molecular weight Mw of the compound was 1,453 in terms of standard polystyrene.

Synthesis Example 11

10.0 g of 2-(0-[1'-methylpropylideneamino]carboxyamino)ethyl methacrylate ([registered trademark] Karenz MOI-BM, manufactured by Showa Denko K.K.), 2.1 g of N-methoxymethylmethacrylamide (manufactured by Wako Pure Chemical Industries, Ltd.), 4.2 g of 2,2,2-trifluoroethyl methacrylate (manufactured by Tokyo Chemical Industry Co., Ltd.), and 3.3 g of 2,2-azobis(isobutylnitrile) (manufactured by Tokyo Chemical Industry Co., Ltd.) were added to 78.2 g of propylene glycol monomethyl ether, and dissolved therein. This solution was added dropwise to a 300 mL flask containing 33.6 g of propylene glycol monomethyl ether heated to 100° C., and after the completion of the dropwise addition, the mixture was stirred for approximately 15 hours. After the completion of the reaction, to this solution, 19.6 g of a cation exchange resin (trade name: DOWEX [registered trademark] 550A, manufactured by Muromachi Technos Co., Ltd.) and 19.6 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-5) above. In the polymer, the proportion of 2-(0-[1'-methylpropylideneamino]carboxyamino)ethyl methacrylate unit:N-methoxymethylmethacrylamide unit:2,2,2-trifluoroethyl methacrylate unit was 50 mol %:20 mol %:30 mol %. The result of GPC analysis of the obtained compound showed that the weight-average molecular weight Mw of the compound was 1,500 in terms of standard polystyrene.

Synthesis Example 12

10.0 g of 2-(0-[1'-methylpropylideneamino]carboxyamino)ethyl methacrylate ([registered trademark] Karenz MOI-BM, manufactured by Showa Denko K.K.), 2.2 g of hydroxypropyl acrylate (manufactured by Sigma-Aldrich Co. LLC.), 4.2 g of 2,2,2-trifluoroethyl methacrylate (manufactured by Tokyo Chemical Industry Co., Ltd.), and 3.3 g of 2,2-azobis(isobutylnitrile) (manufactured by Tokyo Chemical Industry Co., Ltd.) were added to 78.3 g of propylene glycol monomethyl ether, and dissolved therein. This solution was added dropwise to a 300 mL flask containing 32.6 g of propylene glycol monomethyl ether heated to 100° C., and after the completion of the dropwise addition, the mixture was stirred for approximately 15 hours. After the completion of the reaction, to this solution, 19.6 g of a cation exchange resin (trade name: DOWEX [registered trademark] 550A, manufactured by Muromachi Technos Co., Ltd.) and 19.6 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-6) above. In the polymer, the proportion of 2-(0-[1'-methylpropylideneamino]carboxyamino)ethyl methacrylate unit:hydroxypropyl acrylate unit:2,2,2-trifluoroethyl methacrylate unit was 50 mol %:20 mol %:30 mol %. The result of GPC analysis of the obtained compound showed that the weight-average molecular weight Mw of the compound was 2,300 in terms of standard polystyrene.

Synthesis Example 13

15.0 g of 2-(0-[1'-methylpropylideneamino]carboxyamino)ethyl methacrylate ([registered trademark] Karenz MOI-BM, manufactured by Showa Denko K.K.), 8.0 g of N-methoxymethylmethacrylamide (manufactured by Wako Pure Chemical Industries, Ltd.), and 4.6 g of 2,2-azobis(isobutylnitrile) (manufactured by Tokyo Chemical Industry Co., Ltd.) were added to 110.4 g of propylene glycol monomethyl ether, and dissolved therein. This solution was added dropwise to a 300 mL flask containing 46.0 g of propylene glycol monomethyl ether heated to 100° C., and after the completion of the dropwise addition, the mixture was stirred for approximately 15 hours. After the completion of the reaction, to this solution, 27.6 g of a cation exchange resin (trade name: DOWEX [registered trademark] 550A, manufactured by Muromachi Technos Co., Ltd.) and 27.6 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (B-7) above. In the polymer, the proportion of 2-(0-[1'-methylpropylideneamino]carboxyamino)ethyl methacrylate unit:N-methoxymethylmethacrylamide unit was 50 mol %:50 mol %. The result of GPC analysis of the obtained compound showed that the weight-average molecular weight Mw of the compound was 2,000 in terms of standard polystyrene.

Synthesis Example 14

5.0 g of N-(4-hydroxyphenyl)methacrylamide (manufactured by Osaka Organic Chemical Industry Ltd.), 0.7 g of methyl methacrylate (manufactured by Tokyo Chemical Industry Co., Ltd.), and 0.7 g of 2,2-azobis(isobutylnitrile) (manufactured by Tokyo Chemical Industry Co., Ltd.) were added to 25.5 g of propylene glycol monomethyl ether, and dissolved therein. This solution was added dropwise to a 100 mL flask containing 10.6 g of propylene glycol monomethyl ether heated to 85° C., and after the completion of the dropwise addition, the mixture was stirred for approximately 15 hours. After the completion of the reaction, to this solution, 6.4 g of a cation exchange resin (trade name: DOWEX [registered trademark] 550A, manufactured by Muromachi Technos Co., Ltd.) and 6.4 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (A-4) above. In the polymer, the proportion of N-(4-hydroxyphenyl)methacrylamide unit:methyl methacrylate unit was 80 mol %:20 mol %. The result of GPC analysis of the obtained compound showed that the weight-average molecular weight Mw of the compound was 4,700 in terms of standard polystyrene.

Synthesis Example 15

1.0 g of N-(4-hydroxyphenyl)methacrylamide (manufactured by Osaka Organic Chemical Industry Ltd.), 5.1 g of methyl methacrylate (manufactured by Tokyo Chemical Industry Co., Ltd.), and 0.7 g of 2,2-azobis(isobutylnitrile) (manufactured by Tokyo Chemical Industry Co., Ltd.) were added to 27.1 g of propylene glycol monomethyl ether, and dissolved therein. This solution was added dropwise to a 100 mL flask containing 11.3 g of propylene glycol monomethyl ether heated to 85° C., and after the completion of the dropwise addition, the mixture was stirred for approximately 15 hours. After the completion of the reaction, to this solution, 6.8 g of a cation exchange resin (trade name: DOWEX [registered trademark] 550A, manufactured by Muromachi Technos Co., Ltd.) and 6.8 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resins were removed. The structure of the obtained polymer was equivalent to the structure of Formula (A-4) above. In the polymer, the proportion of N-(4-hydroxyphenyl)methacrylamide unit:methyl methacrylate unit was 10 mol %:90 mol %. The result of GPC analysis of the obtained compound showed that the weight-average molecular weight Mw of the compound was 4,300 in terms of standard polystyrene.

Example 1

5.8 g of the polymer solution containing 0.58 g of the resin obtained in Synthesis Example 1, 1.08 g of the polymer solution containing 0.12 g of the resin obtained in Synthesis Example 3, and 0.00058 g of a surfactant (trade name: MEGAFACE [registered trademark] R-40, manufactured by DIC Corporation) were dissolved in 1.9 g of propylene glycol monomethyl ether acetate, 0.31 g of propylene glycol monomethyl ether, and 0.93 g of gamma-butyl lactone to prepare a solution of a resist underlayer film-forming composition for use in a lithography process using a multilayer film.

Example 2

5.8 g of the polymer solution containing 0.58 g of the resin obtained in Synthesis Example 1, 1.1 g of the polymer solution containing 0.12 g of the resin obtained in Synthesis Example 4, and 0.0006 g of a surfactant (trade name: MEGAFACE [registered trademark] R-40, manufactured by DIC Corporation) were dissolved in 1.9 g of propylene glycol monomethyl ether acetate, 0.26 g of propylene glycol monomethyl ether, and 0.93 g of gamma-butyl lactone to prepare a solution of a resist underlayer film-forming composition for use in a lithography process using a multilayer film.

Example 3

5.8 g of the polymer solution containing 0.58 g of the resin obtained in Synthesis Example 1, 1.0 g of the polymer solution containing 0.12 g of the resin obtained in Synthesis Example 5, and 0.0006 g of a surfactant (trade name: MEGAFACE [registered trademark] R-40, manufactured by DIC Corporation) were dissolved in 1.9 g of propylene glycol monomethyl ether acetate, 0.35 g of propylene glycol monomethyl ether, and 0.93 g of gamma-butyl lactone to prepare a solution of a resist underlayer film-forming composition for use in a lithography process using a multilayer film.

Example 4

5.8 g of the polymer solution containing 0.58 g of the resin obtained in Synthesis Example 1, 1.0 g of the polymer solution containing 0.11 g of the resin obtained in Synthesis Example 6, and 0.0006 g of a surfactant (trade name: MEGAFACE [registered trademark] R-40, manufactured by DIC Corporation) were dissolved in 1.9 g of propylene glycol monomethyl ether acetate, 0.33 g of propylene glycol monomethyl ether, and 0.93 g of gamma-butyl lactone to prepare a solution of a resist underlayer film-forming composition for use in a lithography process using a multilayer film.

Example 5

5.6 g of the polymer solution containing 0.56 g of the resin obtained in Synthesis Example 1, 1.3 g of the polymer solution containing 0.12 g of the resin obtained in Synthesis Example 7, and 0.0006 g of a surfactant (trade name: MEGAFACE [registered trademark] R-40, manufactured by DIC Corporation) were dissolved in 1.9 g of propylene glycol monomethyl ether acetate, 0.28 g of propylene glycol monomethyl ether, and 0.93 g of gamma-butyl lactone to prepare a solution of a resist underlayer film-forming composition for use in a lithography process using a multilayer film.

Example 6

5.8 g of the polymer solution containing 0.58 g of the resin obtained in Synthesis Example 1, 1.1 g of the polymer solution containing 0.12 g of the resin obtained in Synthesis Example 10, and 0.0006 g of a surfactant (trade name: MEGAFACE [registered trademark] R-40, manufactured by DIC Corporation) were dissolved in 1.9 g of propylene glycol monomethyl ether acetate, 0.27 g of propylene glycol monomethyl ether, and 0.93 g of gamma-butyl lactone to prepare a solution of a resist underlayer film-forming composition for use in a lithography process using a multilayer film.

Example 7

5.8 g of the polymer solution containing 0.58 g of the resin obtained in Synthesis Example 1, 1.2 g of the polymer solution containing 0.12 g of the resin obtained in Synthesis Example 11, and 0.00058 g of a surfactant (trade name: MEGAFACE [registered trademark] R-40, manufactured by DIC Corporation) were dissolved in 1.9 g of propylene glycol monomethyl ether acetate, 0.16 g of propylene glycol monomethyl ether, and 0.93 g of gamma-butyl lactone to prepare a solution of a resist underlayer film-forming composition for use in a lithography process using a multilayer film.

Example 8

5.8 g of the polymer solution containing 0.58 g of the resin obtained in Synthesis Example 1, 1.1 g of the polymer solution containing 0.12 g of the resin obtained in Synthesis Example 12, and 0.00056 g of a surfactant (trade name: MEGAFACE [registered trademark] R-40, manufactured by DIC Corporation) were dissolved in 1.9 g of propylene glycol monomethyl ether acetate, 0.27 g of propylene glycol monomethyl ether, and 0.93 g of gamma-butyl lactone to prepare a solution of a resist underlayer film-forming composition for use in a lithography process using a multilayer film.

Example 9

5.6 g of the polymer solution containing 0.56 g of the resin obtained in Synthesis Example 2, 1.2 g of the polymer solution containing 0.14 g of the resin obtained in Synthesis Example 5, and 0.00056 g of a surfactant (trade name: MEGAFACE [registered trademark] R-40, manufactured by DIC Corporation) were dissolved in 1.9 g of propylene glycol monomethyl ether acetate, 0.37 g of propylene glycol monomethyl ether, and 0.93 g of gamma-butyl lactone to prepare a solution of a resist underlayer film-forming composition for use in a lithography process using a multilayer film.

Example 10

5.6 g of the polymer solution containing 0.54 g of the resin obtained in Synthesis Example 2, 1.3 g of the polymer solution containing 0.14 g of the resin obtained in Synthesis Example 7, and 0.00056 g of a surfactant (trade name: MEGAFACE [registered trademark] R-40, manufactured by DIC Corporation) were dissolved in 1.9 g of propylene glycol monomethyl ether acetate, 0.35 g of propylene glycol monomethyl ether, and 0.93 g of gamma-butyl lactone to prepare a solution of a resist underlayer film-forming composition for use in a lithography process using a multilayer film.

Example 11

5.4 g of the polymer solution containing 0.54 g of the resin obtained in Synthesis Example 2, 1.6 g of the polymer solution containing 0.16 g of the resin obtained in Synthesis Example 7, and 0.00056 g of a surfactant (trade name: MEGAFACE [registered trademark] R-40, manufactured by DIC Corporation) were dissolved in 1.9 g of propylene glycol monomethyl ether acetate, 0.29 g of propylene glycol monomethyl ether, and 0.93 g of gamma-butyl lactone to prepare a solution of a resist underlayer film-forming composition for use in a lithography process using a multilayer film.

Example 12

5.6 g of the polymer solution containing 0.56 g of the resin obtained in Synthesis Example 2, 1.5 g of the polymer solution containing 0.14 g of the resin obtained in Synthesis Example 11, and 0.00056 g of a surfactant (trade name: MEGAFACE [registered trademark] R-40, manufactured by DIC Corporation) were dissolved in 1.9 g of propylene glycol monomethyl ether acetate, 0.15 g of propylene glycol monomethyl ether, and 0.93 g of gamma-butyl lactone to prepare a solution of a resist underlayer film-forming composition for use in a lithography process using a multilayer film.

Example 13

5.6 g of the polymer solution containing 0.56 g of the resin obtained in Synthesis Example 2, 1.3 g of the polymer solution containing 0.14 g of the resin obtained in Synthesis Example 11, and 0.00056 g of a surfactant (trade name: MEGAFACE [registered trademark] R-40, manufactured by DIC Corporation) were dissolved in 1.9 g of propylene glycol monomethyl ether acetate, 0.28 g of propylene glycol monomethyl ether, and 0.93 g of gamma-butyl lactone to prepare a solution of a resist underlayer film-forming composition for use in a lithography process using a multilayer film.

Example 14

2.7 g of the polymer solution containing 0.50 g of the resin obtained in Synthesis Example 2, 2.2 g of the polymer solution containing 0.20 g of the resin obtained in Synthesis Example 13, and 0.00050 g of a surfactant (trade name: MEGAFACE [registered trademark] R-40, manufactured by DIC Corporation) were dissolved in 1.9 g of propylene glycol monomethyl ether acetate, 2.4 g of propylene glycol monomethyl ether, and 0.93 g of gamma-butyl lactone to prepare a solution of a resist underlayer film-forming composition for use in a lithography process using a multilayer film.

Comparative Example 1

8.9 g of the polymer solution containing 1.1 g of the resin obtained in Synthesis Example 14, 0.3 g of an isocyanate-based cross-linking agent (blocked polyisocyanate protected with an oxime group based on an isophorone diisocyanate structure, trade name: VESTANAT [registered trademark] B1358, manufactured by Degussa Japan Co., Ltd.), and 0.001 g of a surfactant (trade name: MEGAFACE [registered trademark] R-40, manufactured by DIC Corporation) were dissolved in 10.7 g of propylene glycol monomethyl ether to prepare a solution of a resist underlayer film-forming composition for use in a lithography process using a multilayer film.

Comparative Example 2

8.3 g of the polymer solution containing 1.1 g of the resin obtained in Synthesis Example 15, 0.3 g of an isocyanate-based cross-linking agent (blocked polyisocyanate protected with an oxime group based on an isophorone diisocyanate structure, trade name: VESTANAT [registered trademark] B1358, manufactured by Degussa Japan Co., Ltd.), and 0.001 g of a surfactant (trade name: MEGAFACE [registered trademark] R-40, manufactured by DIC Corporation) were dissolved in 11.3 g of propylene glycol monomethyl ether to prepare a solution of a resist underlayer film-forming composition for use in a lithography process using a multilayer film.

(Elution Test into Photoresist Solvent)

The solutions of the resist underlayer film-forming compositions prepared in Examples 1 to 14 and Comparative Examples 1 and 2 were applied to silicon wafers using a spin coater. The coated wafers were each baked on a hot plate at 240° C. for one minute to form resist underlayer films (film thickness: 0.20 μm). Immersion tests of these resist underlayer films in OK thinner (trade name, manufactured by TOKYO OHKA KOGYO CO., LTD.: containing propylene glycol monomethyl ether and propylene glycol monomethyl ether acetate at a volume ratio of 7:3), serving as a solvent used for resists, were carried out. The residual film ratio was obtained in such a manner that each of the resist underlayer films was placed on a spin coater rotating at 2,000 rpm, then the OK thinner serving as a solvent was added dropwise to each of the resist underlayer film for 60 seconds, and immediately after that, the spin coater was rotated at 3,000 rpm for 30 seconds. Table 1 shows the results. The residual film ratio was calculated by (Film thickness after immersion)/(Film thickness before immersion)×100.

TABLE 1

| Residual film ratio after elution test (%) | | |
|---|---|---|
| Example 1 | Film after baking at 240° C. | 99% |
| Example 2 | Film after baking at 240° C. | 99% |
| Example 3 | Film after baking at 240° C. | 99% |
| Example 4 | Film after baking at 240° C. | 99% |
| Example 5 | Film after baking at 240° C. | 99% |
| Example 6 | Film after baking at 240° C. | 99% |
| Example 7 | Film after baking at 240° C. | 99% |
| Example 8 | Film after baking at 240° C. | 100% |
| Example 9 | Film after baking at 240° C. | 99% |
| Example 10 | Film after baking at 240° C. | 99% |
| Example 11 | Film after baking at 240° C. | 99% |
| Example 12 | Film after baking at 240° C. | 99% |
| Example 13 | Film after baking at 240° C. | 99% |
| Example 14 | Film after baking at 240° C. | 99% |
| Comparative Example 1 | Film after baking at 240° C. | 99% |
| Comparative Example 2 | Film after baking at 240° C. | 0% |

(Evaluation of Step-Covering Property)

The solutions of the resist underlayer film-forming compositions prepared in Examples 1 to 14 and Comparative Examples 1 to 2 each were applied to a stepped substrate using a spinner. The adopted stepped substrate (manufactured by ADVANTEC) had a step height of 400 nm and an L/S (line and space) of 120 nm/120 nm, and was covered with a silicon oxide film. After the application of the solutions, the obtained samples were baked at 240° C. for 60 seconds, then, the sections of the samples were observed by scanning electron microscope (SEM). Table 2 shows the results. The samples covered without voids were evaluated as good, and the samples having voids observed were evaluated as poor.

TABLE 2

| Evaluation result of step-covering property | | |
|---|---|---|
| Example 1 | Film after baking at 240° C. | Good |
| Example 2 | Film after baking at 240° C. | Good |
| Example 3 | Film after baking at 240° C. | Good |
| Example 4 | Film after baking at 240° C. | Good |
| Example 5 | Film after baking at 240° C. | Good |
| Example 6 | Film after baking at 240° C. | Good |
| Example 7 | Film after baking at 240° C. | Good |
| Example 8 | Film after baking at 240° C. | Good |
| Example 9 | Film after baking at 240° C. | Good |
| Example 10 | Film after baking at 240° C. | Good |
| Example 11 | Film after baking at 240° C. | Good |

TABLE 2-continued

| Evaluation result of step-covering property | | |
|---|---|---|
| Example 12 | Film after baking at 240° C. | Good |
| Example 13 | Film after baking at 240° C. | Good |
| Example 14 | Film after baking at 240° C. | Good |
| Comparative Example 1 | Film after baking at 240° C. | Poor |
| Comparative Example 2 | Film alter baking at 240° C. | Poor |

INDUSTRIAL APPLICABILITY

The present invention is applicable to a method of forming a resist pattern using a resist underlayer film-forming composition for lithography. Furthermore, the present invention provides a resist underlayer film-forming composition for forming a resist underlayer film capable of being dry-etched during pattern transfer from the upper layer or during substrate processing and capable of being removed with an alkaline aqueous solution after the substrate processing.

The invention claimed is:

1. A method of manufacturing a semiconductor device, the method comprising the steps of:
    forming a resist underlayer film from a resist underlayer film-forming composition on a semiconductor substrate, the resist underlayer film-forming composition comprising:
        a polymer (A) having an acrylamide structure or an acrylic acid ester structure, wherein the polymer (A) is a polymer including a unit structure of Formula (1):

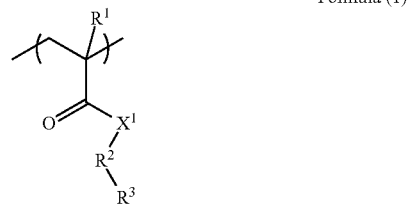

Formula (1)

where $R^1$ is a hydrogen atom or a methyl group, $X^1$ is an NH group or an oxygen atom, $R^2$ is an aromatic ring, and $R^3$ is a hydroxy group or a carboxy group, and wherein a weight average molecular weight of the polymer (A) is in a range of 1,000 to 1,000,000;

a polymer (B) having a blocked isocyanate structure, wherein the polymer (B) is a polymer including a unit structure of Formula (2):

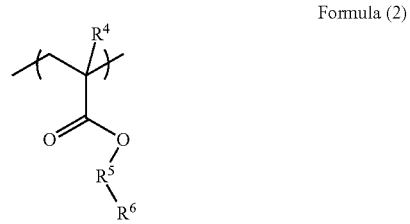

Formula (2)

where $R^4$ is a hydrogen atom or a methyl group, $R^5$ is a single bond or an alkylene group, and $R^6$ is a blocked isocyanate group, and wherein a weight average molecular weight of the polymer (B) is in a range of 1,000 to 1,000,000; and a solvent (C), wherein the polymer (A) and the polymer (B) are included such that a molar ratio of the hydroxy group or the carboxy group to the blocked isocyanate group is 1:0.005 to 1.0;

forming a resist film on the resist underlayer film;

forming a resist pattern in the resist film through light or electron beam irradiation and development;

etching the resist underlayer film using the formed resist pattern;

processing the semiconductor substrate using the patterned resist underlayer film; and removing the patterned resist underlayer film with an alkaline aqueous solution.

2. The method according to claim 1, wherein the semiconductor substrate is a stepped substrate.

3. A method of manufacturing a semiconductor device, the method comprising the steps of:

forming a resist underlayer film from a resist underlayer film-forming composition on a semiconductor substrate, the resist underlayer film-forming composition comprising:

a polymer (A) having an acrylamide structure or an acrylic acid ester structure, wherein the polymer (A) is a polymer including a unit structure of Formula (1):

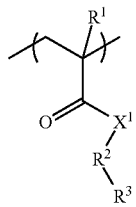

Formula (1)

where $R^1$ is a hydrogen atom or a methyl group, $X^1$ is an NH group or an oxygen atom, $R^2$ is an aromatic ring, and $R^3$ is a hydroxy group or a carboxy group, and wherein a weight average molecular weight of the polymer (A) is in a range of 1,000 to 1,000,000;

a polymer (B) having a blocked isocyanate structure, wherein the polymer (B) is a polymer including a unit structure of Formula (2):

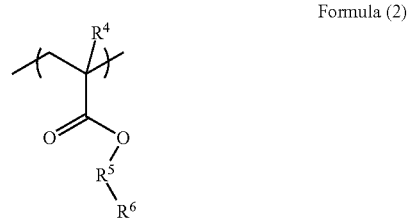

Formula (2)

where $R^4$ is a hydrogen atom or a methyl group, $R^5$ is a single bond or an alkylene group, and $R^6$ is a blocked isocyanate group, and wherein a weight average molecular weight of the polymer (B) is in a range of 1,000 to 1,000,000; and a solvent (C), wherein the polymer (A) and the polymer (B) are included such that a molar ratio of the hydroxy group or the carboxy group to the blocked isocyanate group is 1:0.005 to 1.0;

forming an inorganic hard mask layer on the resist underlayer film;

further forming a resist film on the inorganic hard mask layer;

forming a resist pattern in the resist film through light or electron beam irradiation and development;

etching the inorganic hard mask layer using the formed resist pattern;

etching the resist underlayer film using the patterned inorganic hard mask layer;

processing the semiconductor substrate using the patterned resist underlayer film; and removing the patterned resist underlayer film with an alkaline aqueous solution.

4. The method according to claim 3, wherein the semiconductor substrate is a stepped substrate.

* * * * *